United States Patent [19]

Schachter

[11] 4,044,888

[45] Aug. 30, 1977

[54] PREFABRICATED CONTACTS FOR PRINTED CIRCUIT CARD CONNECTORS

[76] Inventor: Herbert I. Schachter, 86 Campbell St., New Hyde Park, N.Y. 11040

[21] Appl. No.: 625,090

[22] Filed: Oct. 23, 1975

[51] Int. Cl.$^2$ .................... B65P 73/02; B23P 15/16
[52] U.S. Cl. .................................. 206/330; 206/820; 29/163.5 R; 339/95 R; 339/17 C
[58] Field of Search ............... 29/163.5 R; 339/95 R, 339/17 C; 206/330, 820

[56] References Cited

U.S. PATENT DOCUMENTS

| | | | |
|---|---|---|---|
| 2,811,702 | 10/1957 | Narozny | 206/330 |
| 2,830,698 | 4/1958 | Coda et al. | 206/330 |
| 3,216,089 | 11/1965 | Dettman | 206/820 |
| 3,438,486 | 4/1969 | Pinkas | 206/820 |
| 3,473,219 | 10/1969 | Randar et al. | 29/163.5 R |
| 3,731,254 | 5/1973 | Ket | 206/820 |
| 3,780,433 | 12/1973 | Lynch | 339/17 C |
| 3,865,459 | 2/1975 | Mills | 339/95 R |

*Primary Examiner*—William Price
*Assistant Examiner*—Douglas B. Farrow
*Attorney, Agent, or Firm*—Lackenbach, Lilling & Siegel

[57] ABSTRACT

Prefabricated fingers suitable for mounting on a printed circuit board for use in conjunction with card edge connectors are provided on a lengthwise strip which may be cut to the desired size to correspond with the number of fingers which are to be mounted on the board. The strip, which may be formed in a roll, includes a pair of parallel carriers. The fingers extend between and are integrally formed with the carriers and are spaced along the lengths thereof and in substantially coplanar relationship therewith. After severing one of the carriers, the resulting free ends of the fingers may be aligned in overlapping relation with the circuit conductor ends to which the fingers are to be joined. After the finger free ends are joined to the printed circuit conductors and after the fingers are joined to the printed circuit board, the remaining carrier which projects beyond the edge of the circuit board is severed from the other ends of the fingers to permit or allow same for mating with a cooperating edge connector which is to be electrically connected to the printed circuit on the board.

23 Claims, 21 Drawing Figures

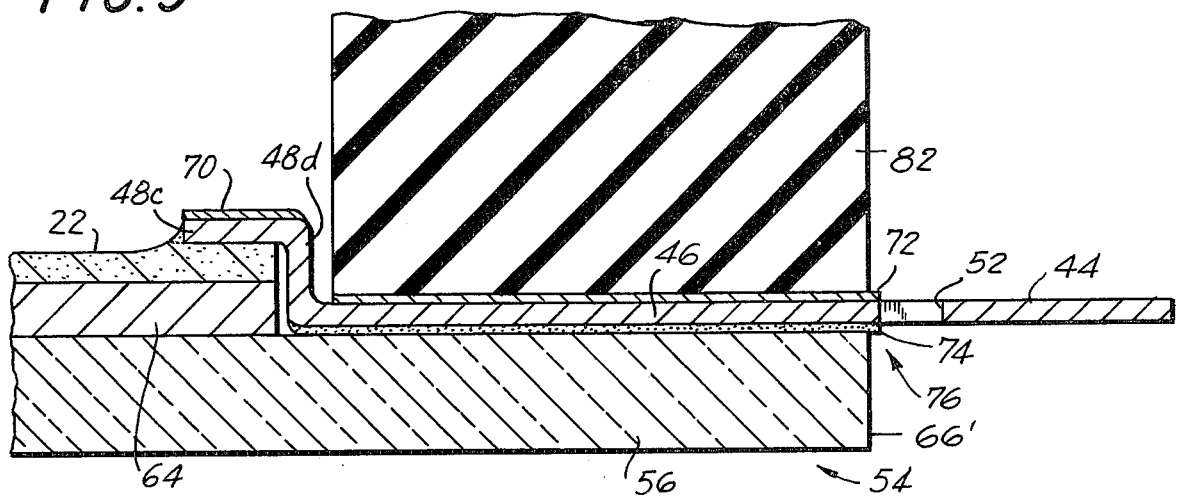
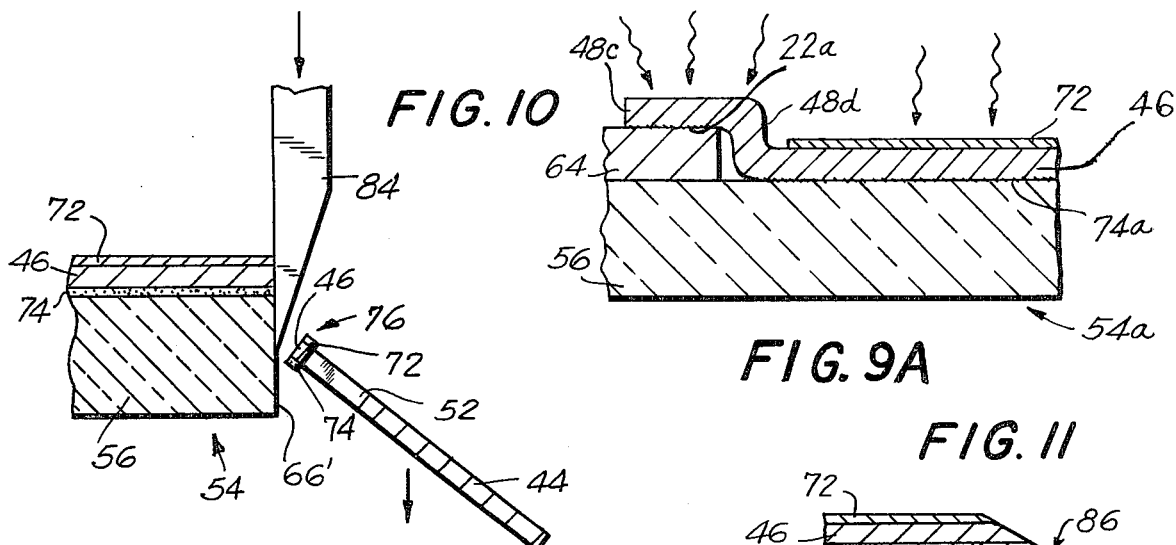
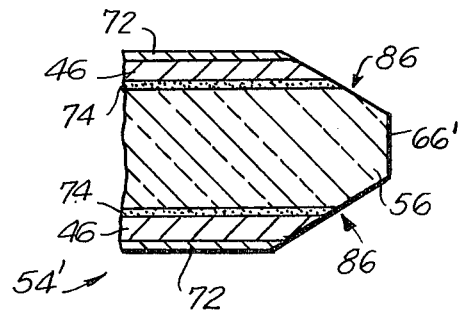
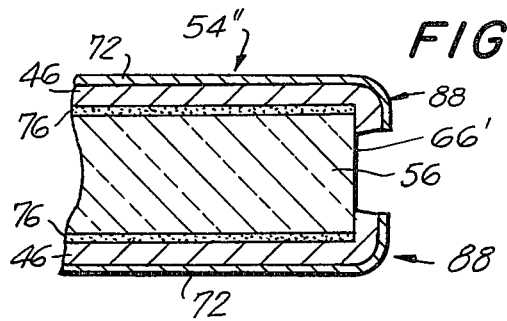

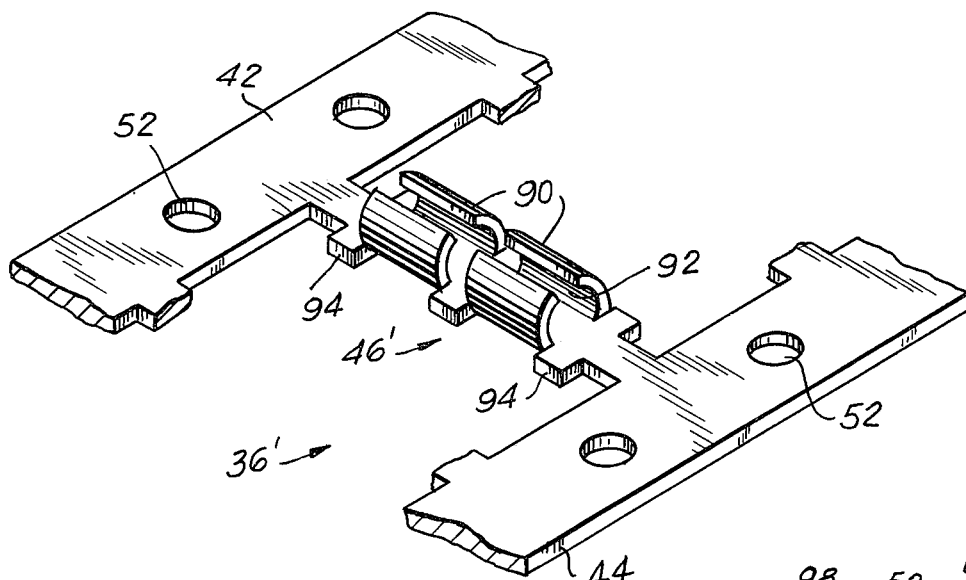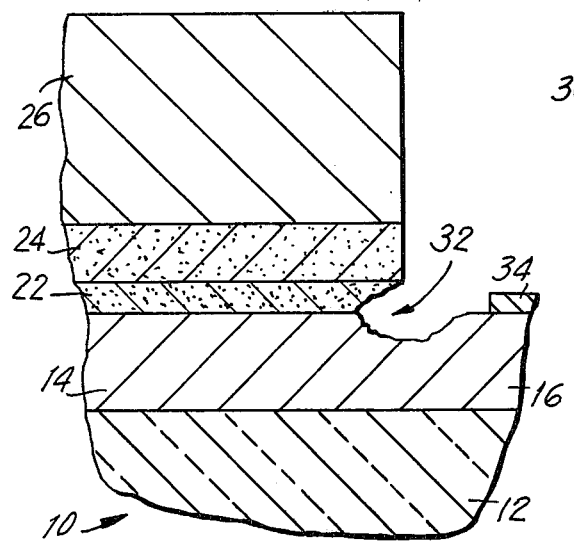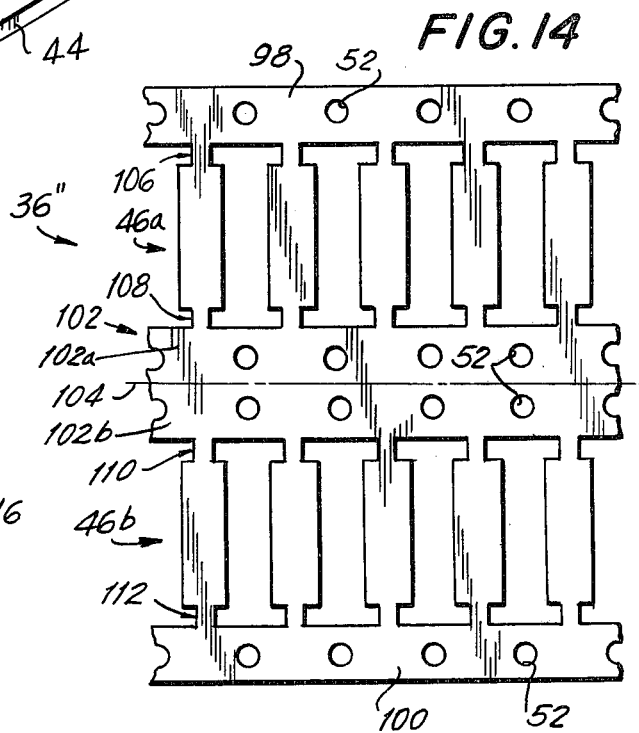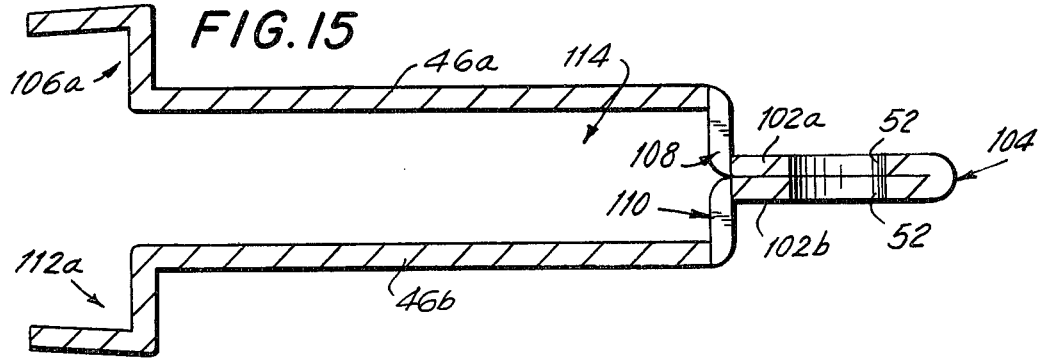

PREFABRICATED CONTACTS FOR PRINTED CIRCUIT CARD CONNECTORS

BACKGROUND OF THE INVENTION

The present invention generally relates to printed circuit connectors, and more specifically to a prefabricated strip of printed circuit fingers or contacts and the method of mounting the same on a printed circuit board.

Electronic circuits, and more particularly the more complex circuits, frequently employ one or more printed circuit boards on which various components or elements are mounted. In order to interconnect the various printed circuit boards, as well as for feeding electrical power and signals to the various circuit elements, and for extracting signals therefrom, various connector arrangements are utilized. Since printed circuits are normally formed on boards or laminate sheets, made of various epoxy compositions or fiberglass and relatively thin layers of copper which have been etched or deposited to define the desired circuit, the problem in each case is one of coupling from the relatively thin circuit conductor leads which are "printed" on the board and a mechanical connector which is generally three-dimensional.

The most frequently used printed circuit connectors being manufactured today fall into three broad design categories: (1) the "edge" type in which the edge of the circuit board mates with a slotted connector; (a) a "two-piece" type where one mating piece is permanently attached to the circuit board; and (3) a "hermaphroditic" connector which combines separately mounted contact banks and a card slot. The present invention is concerned with all three types. The examples illustrated primarily show the edge type in which the edge of the circuit board mates with a slotted connector. The slotted connectors may include various contact configurations, to be more fully described in the specification.

A problem has existed and continues to exist with respect to the formation of the printed circuit fingers, contacts or terminals which mate with the card-edge connectors. As will be more fully described in connection with FIGS. 17–20, the known methods of forming the fingers on cards, including plating the fingers and otherwise imparting desirable characteristics thereto, is a complex procedure requiring many and costly steps. Additionally, the commonly used technique for forming such printed circuit fingers on circuit boards suffers the disadvantage that the "printed" circuit on the board is frequently damaged during the formation or processing of the fingers so that numerous printed circuit boards must be rejected because they fail the quality control criteria for such boards. The high rate of rejection of the boards results, of course, in a substantial increase in the cost of manufacture of such printed circuit boards.

Due to the cumbersome and expensive method of forming printed circuit fingers suitable for use with edge connectors, various devices and methods have been proposed to facilitate the procedure as well as to reduce the high rejection rate. However, numerous problems have persisted and the cost and rejection rate are still unsatisfactory with the presently known and commonly used techniques.

Due to the complex and expensive procedure above suggested in the formation of contact terminals or fingers for printed circuit boards, the techniques and procedures used in the manufacture of the commercial or finalized boards could not practically be used to any great extent during the bread-boarding or development stages. There have been proposed various printed circuit aids, of the dry transfer of pressure-sensitive type, which are provided in bread-boarding kits for printed circuit boards. Examples of such bread-boarding aids are disclosed in U.S. Pat. Nos. 3,538,389 and 3,703,603. The earlier patent is entitled "Sub-element for Electronic Circuit Boards" and discloses sub-elements in the form of thin epoxy or plastic strips, having a basic circuit formed thereon by printed circuit techniques. To assist in the mounting of the sub-elements, the thin strips are backed with a pressure-sensitive or other type of adhesive, which forms a backing for the strips. It is recommended in that disclosure that the adhesive backing be covered with a release or backing paper or sheet. However, with the sub-elements disclosed in the earlier patent, the carrier to strip which carries the sub-elements or conductors remains attached to and becomes part of the printed circuit board configuration after the conductor elements are mounted on the circuit board. While this may be satisfactory for bread-boarding purposes, it is not satisfactory for final assembly where the conductive elements must be permanently and reliably fixed to the printed circuit board.

The later patent discloses the use of sub-elements which may be adhesively attached to a panel-like base or circuit board. The sub-elements are in the form of conductive metallic particles which are adhesively attached to a carrier strip, such as plastic or wax paper, the particles being intermixed with adhesive material. The sub-elements are formed of a basic compound which include, for example, copper, adhesive, adhesive activating and electrolyte or other conductor particles. The basic compound is screened on to a carrier with a releasing agent coating being provided between the carrier and the sub-elements formed out of the compound. A release strip, in the form of wax paper, plastic, parchment or tissue is provided on the other side of the sub-elements so that the sub-elements are in effect sandwiched between a release strip and a carrier strip. The sub-elements are applied to a circuit board laminate sheet by first removing the release strip. The basic compound design is then placed on the surface of the laminate sheet and the top surface of the carrier is rubbed by a suitable tool. The resulting heat and pressure causes the compound design to become adhesively attached to the laminate sheet, with the heat generated by the rubbing action melting the release agent coating which exists between the compound design and the carrier. The carrier can then be removed from the resulting circuit.

While the rub-on sub-elements disclosed in the above patents facilitate bread-boarding of printed circuits, the sub-elements and methods of mounting the same disclosed in the above patents are not suitable for the manufacture of final assemblies where reliability is of primary concern. Additionally, the rub-on sub-elements require various steps to mount the sub-elements on the printed circuit boards, some of which steps must be performed manually and therefore the known printed circuit sub-elements cannot and are not intended to be automatically mounted during mass production. Being intended primarily for bread-boarding, the somewhat complicated construction of the rub-on sub-elements as well as the high cost thereof is tolerable. However, such rub-on sub-elements become impractical and overly expensive for mass production runs. The sub-elements of the type disclosed in the above patents are typically provided on carriers which have limited dimensions and this limits the number of connector sub-elements which can be mounted on a circuit board for use with edge-type printed circuit connectors. A primary disadvantage, however, of the sub-elements disclosed in the above patents, is that they cannot be mounted on circuit boards with the degree of permanency which is required to provide a reliable finished assembly. Another advantage over the prior art is that the invention lends itself to semi-automatic or automatic application of the contacts, and permits extremely accurate alignments of the contacts, regardless of however small the center to center spacing is and/or how narrow the width of the contacts are.

SUMMARY OF THE INVENTION

Accordingly, it is an object of the present invention to provide an arrangement of conductive contact elements for mounting on a printed circuit board which does not possess the disadvantages of prior or known arrangements or methods as suggested above.

Another object of the present invention is to provide an arrangement of conductive contact elements for printed circuit boards which is simple in construction and economical to manufacture.

It is still another object of the present invention to provide an arrangement of conductive contact elements for printed circuit boards which substantially increases the reliability of the completed circuit boards and substantially reduces the rejection rate during the manufacture thereof.

It is yet another object of the present invention to provide an arrangement of conductive contact elements which can be utilized to provide as few or as many electrical fingers or contacts for edge-type printed circuit connectors.

It is a further object of the present invention to provide an arrangement of conductive contact elements which permits and facilitates automated mounting of the printed circuit contact fingers or terminal contacts for mating with suitable connectors.

It is still a further object of the present invention to provide an arrangement of conductive contact elements which produces printed circuit contacts or terminal fingers for mating with suitable connectors, which fingers are mounted at least as reliably as with prior art techniques while substantially reducing the number of steps and expense in the formation of such fingers.

It is yet a further object of the present invention to provide an arrangement of conductive contact elements for mounting on a printed circuit board to form an array of serially spaced contacts or terminals and which is provided in the form of an elongate strip or roll of such contacts or terminals which are prefabricated to provide these with the desired electrical and mechanical characteristics once these contacts or terminals are mounted on the printed circuit board.

It is an additional object of the present invention to provide an arrangement generally of the type above-suggested which can provide both male pin terminals or female connector receptacles for printed circuit card edge or special connectors.

It is yet an additional object of the present invention to provide an arrangement of conductive contact elements generally as suggested in the above objects which is suitable for providing twin or dual fingers aligned with each other on opposite sides of a printed circuit board for mating with printed circuit edge-type connectors having two rows of contacts.

It is yet an additional object of the present invention to provide a simple and economical method for mounting the fingers or terminals of the type above described on a printed circuit board.

In order to achieve the above objects, as well as others which will become apparent hereafter, the present invention relates to an arrangement of conductive contact elements for mounting on a printed circuit board to form an array of serially spaced contacts or terminals at the free ends of a plurality of circuit leads or conductors on a circuit board. One arrangement includes a pair of elongate spaced carriers which are parallel to each other. A plurality of elongate planar fingers made from an electrical conductive material are provided, said fingers being parallel to each other and serially spaced along the length direction of said carriers, each of said fingers being oriented in a direction substantially normal to the length direction of the carriers. The fingers each have a length generally equal to the spacing between said carriers and extend between and are connected to the same to maintain the parallel orientation in spacing between said fingers. Attaching means is provided on said fingers for attaching the same to the circuit board. In this manner, severance of one of said pair of carriers exposes one set of free ends of said fingers for attaching the same to similarly spaced associated free ends of circuit leads or conductors on the circuit board while the other of said pair of carriers secures and positions said fingers during attachment of the same to the circuit board and to said circuit leads or conductors. Subsequent severance of the other of said pair of carriers exposes the other set of free ends of said fingers for mating with cooperating connector elements on a connector to be electrically connected with the printed circuits on said board.

The method of the present invention relates to the mounting of a prefabricated strip of conductive contact elements which are in the form of fingers on a printed circuit board to form an array of serially spaced contacts or terminals at the end of a plurality of circuit leads or conductors on the circuit board. The method comprises the steps of feeding a prefabricated strip comprising at least one elongate carrier and a plurality of spaced parallel fingers made out of electrically conductive material each of which is disposed generally normally to said carrier. Each of said fingers is connected at one end to said carrier and has a free end at the other end thereof. The free ends of said fingers are aligned with the free ends of the plurality of circuit leads or conductors and said fingers are positioned proximate to the circuit board portions on which said fingers are to be mounted. Said carrier and at least finger portions which are connected to said carrier extend beyond the edge of the circuit board. Said finger free ends are first joined to said free ends of said plurality of associated leads or conductors and said fingers are secondly joined to the circuit board. Said carrier and said finger portions connected to said carrier which extend beyond the edge of the circuit board are severed to form free ends at said one end of said fingers for mating with cooperating connector elements on a connector to be electrically connected to the printed circuit or said board.

BRIEF DESCRIPTION OF THE DRAWINGS:

The invention is pointed out with particularity in the appended claims. However, other objects and features of the present invention will become apparent and the invention itself will be best understood by referring to the following description and embodiments taken in conjunction with the accompanying drawings, in which:

FIG. 9 is similar to FIGS. 7 and 8, but showing the application of a heated bar or element which applies heat along the entire length of the finger to activate a temperature sensitive adhesive which is disposed between the fingers and the printed circuit laminate sheet;

FIG. 9A is a view similar to FIG. 9, but illustrating alternate methods of electrically connecting one end of a contact or finger to a circuit conductor and mechanically bonding the remaining portion of the contact to the circuit board;

FIG. 10 is similar to FIG. 9, and showing a knife shearing the remaining carrier as well as a portion of the finger which extends beyond the edge of the printed circuit board subsequent to the bonding of the finger to the same;

FIG. 11 is a cross-sectional view similar to FIG. 10, but showing fingers in accordance with the present invention mounted on both surfaces of the printed circuit board and further showing the provision of bevels at the upper and lower edges of the printed circuit board where the fingers are mounted to facilitate insertion in printed circuit card-edge connectors;

FIG. 12 is similar to FIG. 11 but showing the manner in which the fingers may be curled substantially simultaneously with the cutting step shown in FIG. 10 instead of providing the bevels shown in FIG. 11 in order to facilitate insertion of the resulting printed circuit card into edge-type printed circuit connectors;

FIG. 13 is a perspective view of a segment of another embodiment in accordance with the present invention, wherein three-dimensional conductive contact elements are formed on the printed circuit board such as female connector receptacles or pins in place of the planar pin-type male fingers shown in FIGS. 1-12;

FIG. 14 is a fragmented plan view of still another embodiment of the present invention, wherein two series or rows of fingers are disposed between three spaced carriers as shown, such strip being suitable for use on printed circuit boards where aligned spaced contacts or terminals are to be provided on two sides of the circuit boards for use with multi-contact printed circuit edge-type connectors;

FIG. 15 is a cross-sectional view of the strip shown in FIG. 14 after the same has been processed to remove the end carriers and to provide the joggles or offset portions at the ends of each of the fingers in each row and configurated in a manner to provide a space for receiving the printed circuit board with the fingers in each of the different rows being disposed on opposite sides of the printed circuit board;

FIGS. 17-20 are various views of a typical prior art procedure known and commonly used in the formation of fingers or contacts on printed circuit boards.

Figure 20:
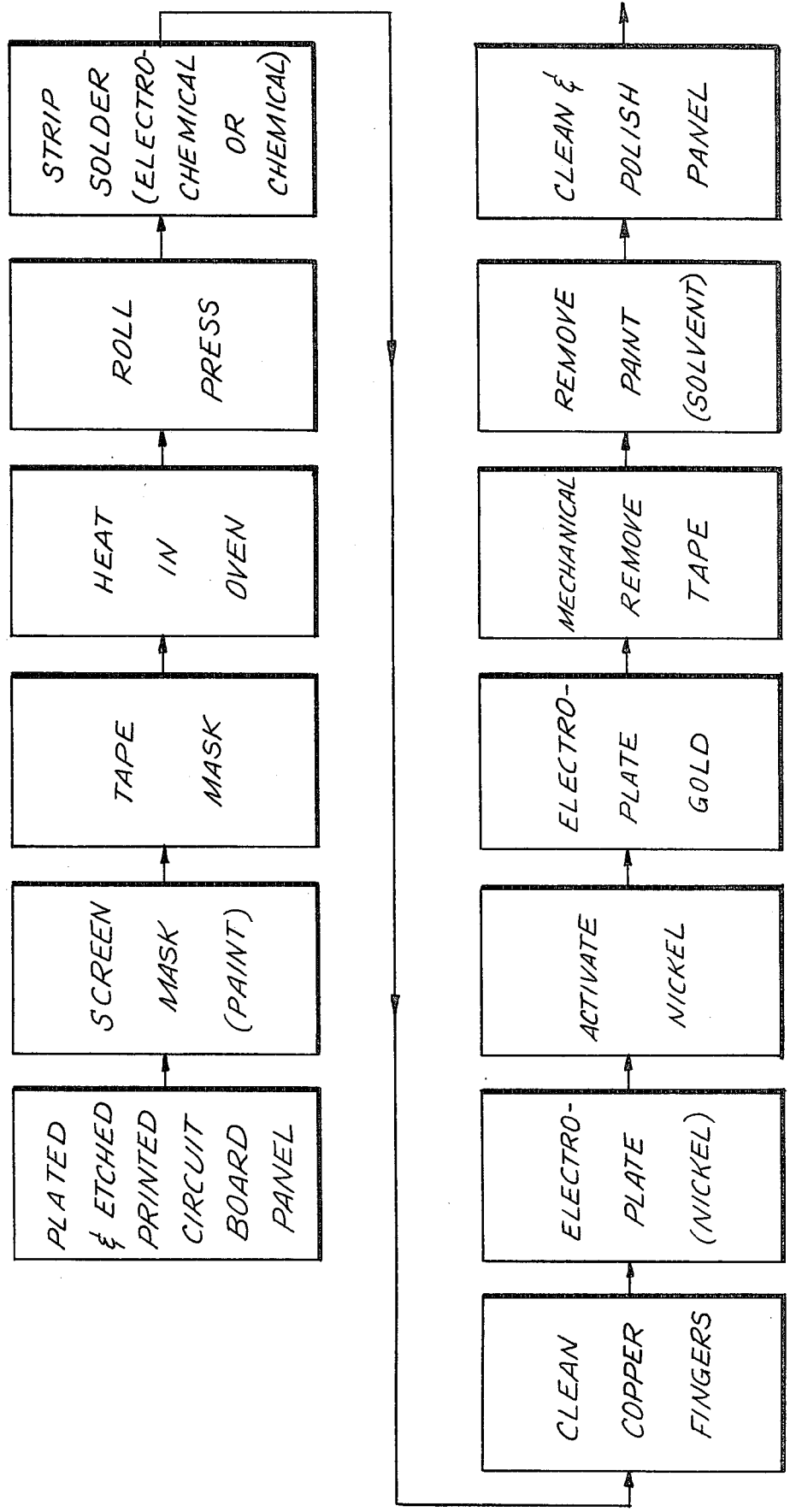

DESCRIPTION OF THE PREFERRED EMBODIMENTS:

Referring now specifically to the drawings, in which identical or similar parts are designated by the same reference numerals throughout, and first referring to FIG. 20, there is shown a typical process or method of forming conductive contact elements in the nature of fingers or terminals for use with card-edge connectors frequently used with printed circuit boards. The process begins with the provision of a plated and etched printed circuit board or panel. The printed circuit board is typically formed from a single or double-clad laminate sheet which may be an epoxy-fiber composition or fibreglass. The board or laminate sheet is clad with thin layers of copper. In accordance with well-known techniques, the upper layers on the printed circuit board are etched or deposited and may be plated to form various pads for mounting of electrical elements or components and electrical conductors or leads which interconnect these pads.

Figure 17:
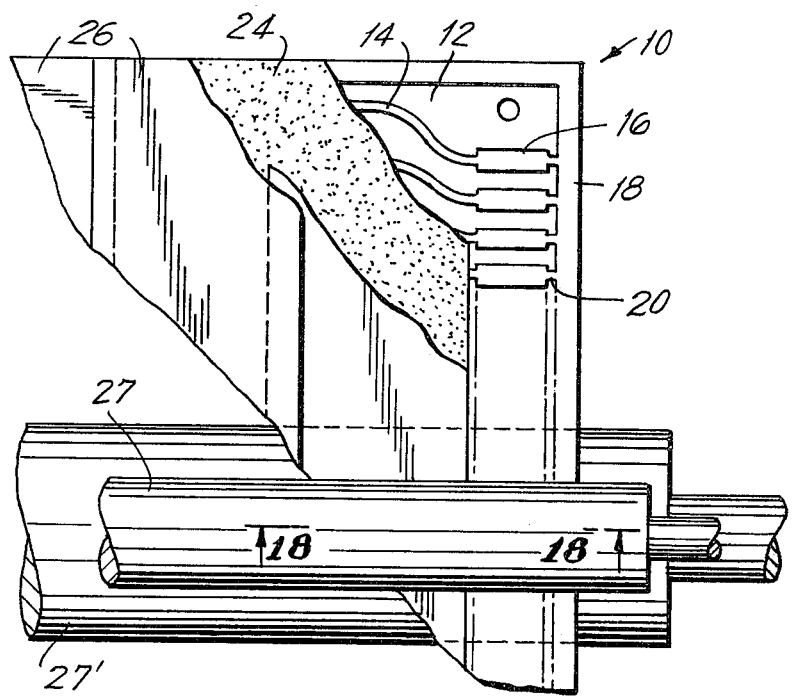

Referring to FIG. 17, the printed circuit board is generally designated by the reference numeral 10. The layers of copper are etched or otherwise processed to expose the laminate sheet 12 and to form thereon various printed circuit leads or conductors 14. The electrical inputs and outputs to the printed circuit are directed through fingers, contacts or connector terminals 16 which form terminations for the printed circuit leads or conductors 14 as shown. The fingers 16 generally form an array of serially spaced contacts or terminals which are suitable for mating with cooperating connector elements on a connector to be electrically connected to the printed circuit on the board 10.

In the prior art technique, the fingers 16 are simultaneously etched together with the various conductors and leads 14 as well as the various pads or circuit elements. However, circuit components are normally soldered or fixedly joined to the various pads or printed circuit leads or conductors while the fingers 16 slidably and releasably mate with card-edge connectors so that the edge-type connectors may be quickly and conveniently engaged and disengaged from the printed circuit board 10. For this reason, the copper which remains on the laminate sheet 12 subsequent to etching is normally dip-soldered or electro-plated with solder to coat the copper conductors with a layer of solder to facilitate subsequent connection to the various electrical components or elements. The fingers 16 are also normally coated with a layer of solder during this process.

It has been customary practice to plate or otherwise provide a layer of non-corrosive material, such as gold, on the fingers 16 to permit repeated connection and disengagement from a printed circuit connector without impairment of the electrical characteristics of the resulting connection. To this end, it is typical practice in accordance with the known techniques to remove the solder layer from the fingers 16 and subsequently plate these fingers with a layer of gold. However, such plating of the fingers 16 must be carried out without plating the rest of the electrical conductors or pads 14 or removing the layer of solder therefrom.

Accordingly, one of the first steps in the cumbersome and expensive process of finishing the fingers 16 is to screen mask or paint the copper conductors 14 of the printed circuit with a layer of paint 24 as shown in FIG. 17, which layer of paint comes up to but does not cover the fingers 16. The printed circuit is then masked with overlapping strips of tape 26 in order to cover all of the apertures or holes and all the copper conductors, again with the exception of the fingers 16. The purpose of masking the printed circuit board as suggested is to protect the copper conductors, including lands and conductors or leads during the plating process of the fingers without damaging the electrical printed circuit.

Figure 18:
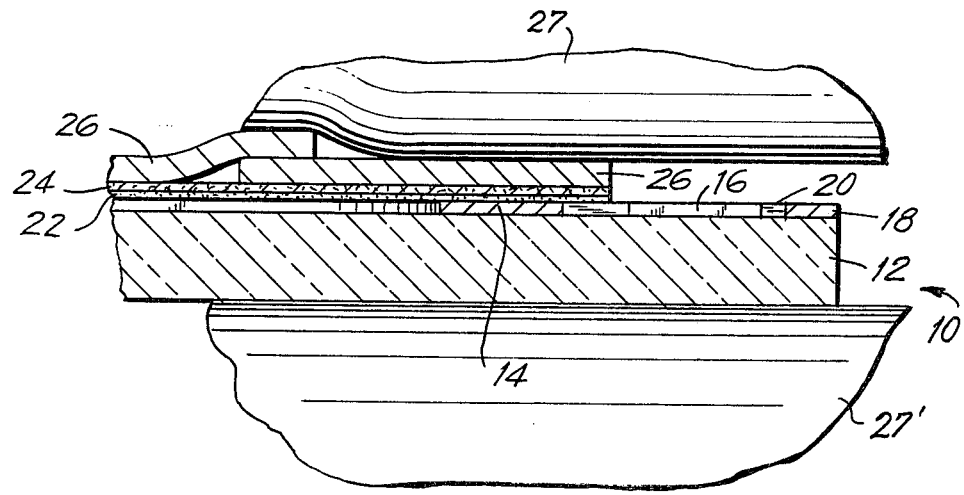

The printed circuit, as masked, is then heated in an oven to a suitable temperature to soften the overlapping strips of tape prior to feeding the masked printed circuit board between a pair of pressure rollers 27, 27' as shown in FIGS. 17 and 18. The pressure rollers 27, 27', such as the flexible rubber rollers shown, improve the seals between the overlapping strips of tape 26 and also improve the bonding between the strips of tape and the printed circuit board generally so as to eliminate any spaces or openings through which the strong and corrosive chemicals may come into contact with the printed circuit board during the numerous plating process steps.

The solder is next stripped from the fingers 16 by electro-chemical or chemical means well known to those skilled in the art. The fingers are then cleaned, such as mechanically, to prepare the same for plating.

In order to plate the fingers 16, there is typically provided a tie bar or "thief" 18 which is in the nature of a common conductor for plating nickel and gold onto the fingers 16. The fingers 16 are connected to the tie bar 18 by means of connecting tabs or strips 20 as shown in FIG. 17. The fingers 16 are next electro-plated with nickel and subsequently this nickel is activated prior to the gold electro-plating step. The gold is then plated or deposited on the nickel layer to a thickness deemed sufficient for the intended application. During the plating process, large current densities are produced which flow through the various plated surfaces, including the connecting tabs 20 and tie bar 18. Additionally, gold is deposited on the connecting tabs or strips 20 as well as on the tie bar 18. The gold deposited on the tabs 20 and tie bar 18 do not serve any useful function and represents wasted gold which must be recovered from these surfaces after the same are separated from the printed circuit board and such recovery represents an additional expense in the manufacture and finishing of the fingers 16.

After the fingers 16 have been gold-plated, the printed circuit is substantially in its finished or completed condition. However, the paint layer 24 as well as the overlapping strips of tape 26 must be removed to again expose the etched conductors or leads and pads which had previously been solder coated. However, due to the extremely good bond between the tape 26 and the printed circuit board which is required in order to prevent corrosive chemicals from making contact with the printed circuit board during the plating of the finger 16, removal of the tape strip 26 is extremely difficult and frequently results in damage to the printed circuit conductors. The strength of the bonds formed between the tape and the printed circuit board is sometimes sufficient to pull off the printed circuit conductors or leads off of the board and thereby irreparably damaging the board.

After the strips of tape 26 have been removed, the layer of paint 24 is removed with, for example, a suitable solvent and the entire panel must be cleaned and polished. As is evident from the above description, the prior art technique for manufacturing and finishing electrical contacts or fingers for use in conjunction with card-edge printed circuit board connectors is somewhat complex and requires numerous steps many of which may result in damage to the circuit board. A common problem in the prior art is shown in FIG. 19, wherein a pitted or eroded area 32 is shown in the region of the printed circuit where the fingers 16 are connected to the circuit leads 14. Such a pitted or corroded area result when the screen masking or painting and tape masking are not adequately consumated so that spaces remain where corrosive chemicals may enter below the tape to corrode portions of the solder as well as the copper layer which together form the printed circuit leads or conductors. When the pitted or eroded areas 32 are of sufficiently large magnitudes, this represents a defect in the board which may cause rejection thereof.

The prior art technique shown and described in relation to FIGS. 17-20 is a typical sequence of steps commonly used to manufacture and finish fingers or contacts for printed circuits. This method is exemplary, although slight modifications may be made in the method as it has been described. For example, in some methods the strips of tapes 26 are removed and subsequently retaped in order to improve the quality or reliability of the finished product. However, as suggested above, removal of the tape may result in damage to the circuit board so that carrying out the step twice increases the likelihood of such damage.

The present invention will now be described, and as will become evident from the description that follows, the present invention overcomes the above-described disadvantages in the prior art techniques of manufacturing and finishing fingers. The resulting fingers or connector terminals are at least as reliable as the fingers which resulted in accordance with the prior art procedures and are substantially more economical to produce. The mounting of the fingers in accordance with the present invention can be automated and virtually eliminates any possibility of damage to the board which would require rejection of the same.

Figure 1:
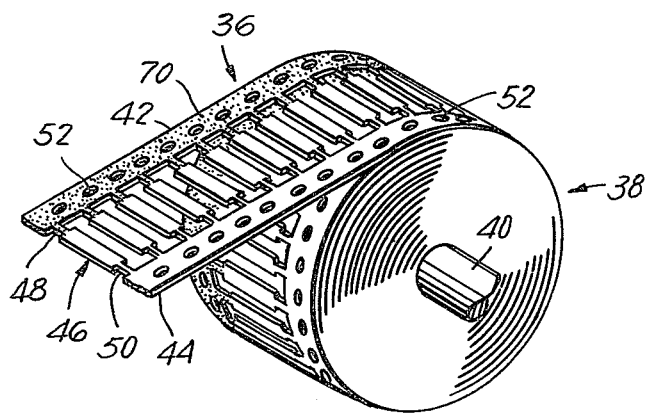
FIG. 1 is a perspective view of an elongate strip in the form of a roll of conductive contact elements for mounting on a printed circuit board in accordance with the present invention, showing the two spaced carriers and coplanar fingers which extend between and are integrally formed with the carriers.
Figure 2:
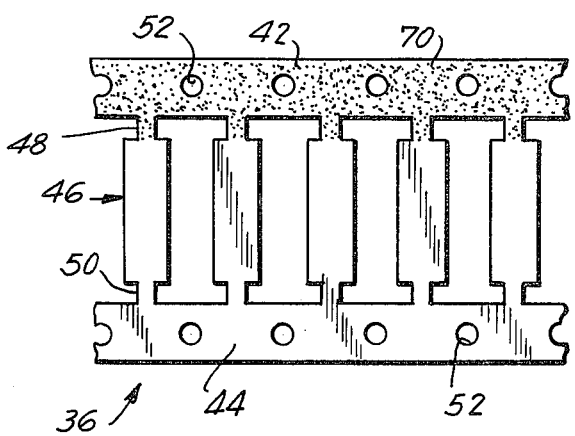
FIG. 2 is an enlarged plan view of a segment of the strip shown in FIG 1.

Referring to FIGS. 1 and 2, the present invention is for an arrangement in the nature of a strip 36 which is generally elongate and may be formed in a roll 38 mounted on a shaft 40 for dispensing of the strip as required and as will be further described below.

The strip 36 includes a pair of elongate spaced carriers 42 and 44 which are parallel to each other. A plurality of elongate pair of fingers 46 made from an electrically conductive material are parallel to each other as shown and serially spaced along the length directions of the carriers 42, 44. The fingers 46 are advantageously uniformly spaced along the carriers, although this is not a necessary requirement. The fingers 46 are serially spaced along the length direction of the carriers and each of the fingers 46 is oriented in a direction substantially normal to the length direction of the carriers 42, 44.

The fingers 46 each have a length generally equal to the spacing between the carriers 42,44 and extend between and are connected to the same to maintain the parallel orientations thereof between the fingers 46. In the presently preferred embodiment, the fingers 46 are connected at one end thereof to the carrier 42 by means of tabs or connecting strips 48 while the other end of the fingers 46 are connected to the carrier 44 by means of tabs or connecting strips 50. In this embodiment, the fingers have a predetermined width and are connected to the spaced carriers 42,44 at the opposing ends thereof by means of the connecting tabs 48,50 which have widths less than the predetermined width of the fingers 46.

In accordance with the presently preferred embodiment, the carriers 42,44 are planar or flat strips and generally co-planar with the fingers 46. Additionally, the carriers are advantageously integrally formed with the fingers 46. The strip 36 as described above is particularly simple to manufacture and may be die-cut or punched from a continuous sheet of conductive material or may be chemically milled from such a sheet. Since the fingers are prefabricated they can be made of any suitable or desirable material and be provided with conventional finishes such as nickel and gold plating.

The above-described construction of this strip 36 maintains the fingers 46 parallel to each other and serially spaced along the length direction of the carriers 42,44 with each of the fingers being orientated in a direction substantially normal to the length direction of the carriers. The fingers 46 each have a length generally equal to the spacing between the carriers 42,44 and extend between and are connected to the same to maintain the parallel orientation and spacing between the fingers. For the purposes of the specification and the claims, the connecting tabs 48,50 are part of the fingers 46.

As should be evident, the carriers 42,44 must have sufficient rigidity, particularly in the longitudinal directions thereof to maintain the fingers 46 in the parallel and spaced conditions as shown. However, any arrangement of carriers which will accomplish the function may be utilized. Thus, it is possible to utilize other forms of carriers, such as elongate wires or rods which need not necessarily be integrally formed with the fingers 46 but which are attached to the ends thereof by conventional means. While two spaced carriers as shown are particularly effective for maintaining the spaced and parallel orientations of the fingers, it is also possible to utilize only one carrier extending along one set of ends of the fingers. When one carrier is used the points of connection to the fingers 46 are desirably reinforced, possible by providing connecting tabs which are wider or at least as wide as the fingers themselves. Other arrangements of carriers which extend along one or both ends of the array of serially spaced fingers 46 will become evident to those skilled in the art as being variations of the presently preferred embodiment shown in FIGS. 1 and 2.

Figure 3:
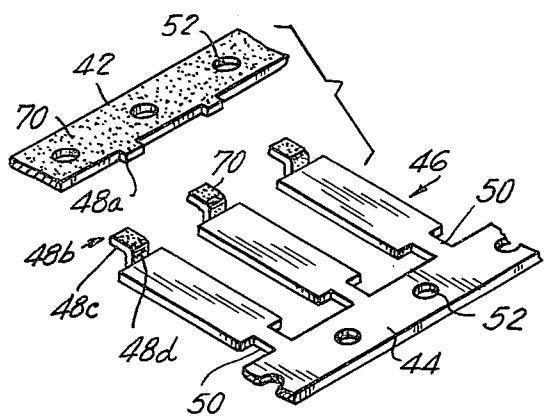
FIG. 3 is a perspective view of a segment of the strip shown in FIG. 2, after one of the carriers is severed from the strip and the connecting tabs which extend between the fingers and the severed carrier are "joggled" or offset to permit suitable overlapping of the offset portions with the printed circuit leads or conductor ends when the fingers are aligned therewith.

As shown in FIGS. 1–3, the carriers 42,44 are advantageously provided with a plurality of spaced sprocket holes 52 along the lengths of the carriers. While only one carrier may be provided with such sprocket holes, the strip 36 of the presently preferred embodiment has sprocket holes on both carriers as shown. The sprocket holes 52 are intended to serve the same or similar function as the sprocket holes on photographic film within a camera or projection apparatus. The sprocket holes 52, which are advantageously arranged between pairs of adjacent fingers as best shown in FIG. 2, are intended to engage sprocket wheels of a feeding apparatus for feeding a predetermined length of the strip 36 from the roll 38 in order to automate the mounting process of the fingers 46 on printed circuit boards, as will be more fully described hereafter. The sprocket holes 52 are shown to be circular although square or any other shaped sprocket holes may be utilized consistent with the dispensing machinery which it utilized for feeding the strip 36.

As will be more fully described hereafter, the method of mounting the fingers 46 on the printed circuit board includes the steps of joining the ends of the fingers to the ends of the printed circuit leads or conductors and joining the main body portions of the fingers 46 to the printed circuit laminate sheet. To this end, the fingers 46 may be pretreated or coated with various materials, such as solder, dry flux or adhesive. Being prefabricated and pretreated as suggested, the fingers 46 need only be properly positioned relative to the circuit board and joined thereto without subjecting the printed circuit board to the various chemical and mechanical process steps, which steps could damage the printed circuit boards as suggested above, to result in rejection thereof.

Figure 4:
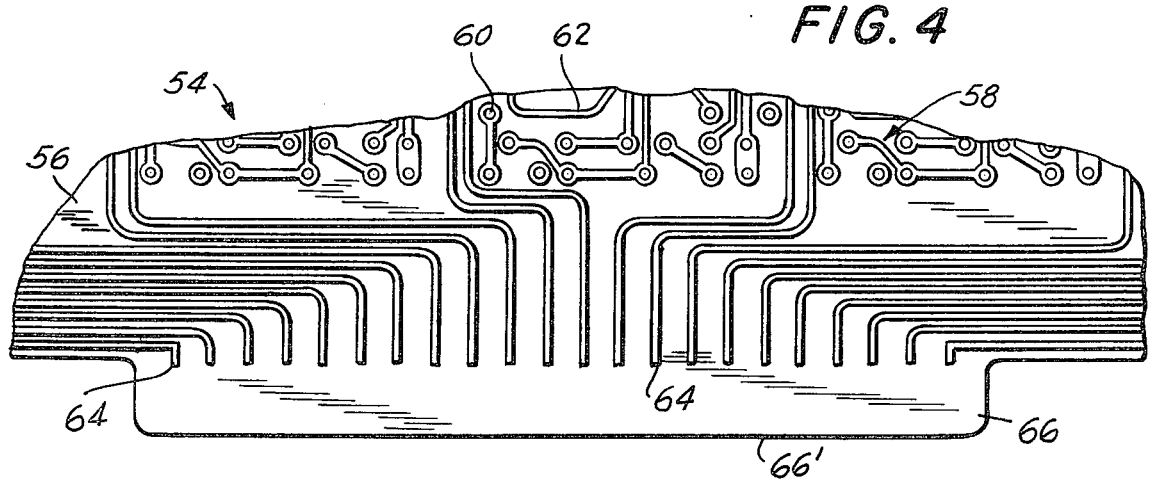
FIG. 4 is a fragmented top plan view of a printed circuit board, showing a printed circuit on a laminate sheet and the manner in which the various leads or conductors terminate in aligned and spaced relation along a board projection or extension suitable for being received within a printed circuit card-edge connector.

Referring to FIG. 4, there is shown a typical printed circuit board 54 which has already been plated and etched to produce a printed circuit 58 thereon. The printed circuit 58 typically includes a plurality of lands 60 and conductors or leads 62 which interconnect the lands as shown. The lands or pads 60 are typically drilled to provide holes contained within the peripheries thereof which holes receive conductors or terminals of various electrical components such as resistors, capacitors, transistors and the like. To provide electrical power to the circuit as well as to feed signals thereto and extract signals therefrom, the conductors 62 normally terminate in one region of the circuit board 54 which is typically formed with a projection or extending portion 66 as shown in FIG. 4 having an edge 66'. The extension 66 is selected to have a width to correspond to the width of an edge-type connector, so that the extension may be received within the connector. The free ends 64 of the printed circuit conductors or leads 62 are normally arranged as shown in FIG. 4 wherein the lead ends are aligned along a straight line parallel to the edge 66' and are uniformly spaced from one another. The leads need not, however, be uniformly spaced and any spacing between adjacent lead ends is possible so long as the spacing corresponds to spacing of the contacts of the connector to which the board is to be mated. In most applications the lead ends are arranged as shown and when the printed circuit 58 is formed for use with the strip 36 of the present invention, the conductor or lead ends 64 terminate at distances spaced from the edge 66' to provide space on the laminate sheet 56 where the fingers 46 can be mounted. It will thus be noted that the printed circuit 58, as distinguished from the printed circuit shown in FIG. 17, is not initially integrally formed with fingers or connector contacts but these are mounted on the laminate sheet 56 in accordance with the procedure to be described. As suggested above, by mounting prefabricated and prefinished fingers 46 on the finished printed circuit board 54, the fingers as well as the printed circuit board can each be independently processed so that the desired characteristics of each may be imparted thereto without the danger of damage to the other.

Figure 16:
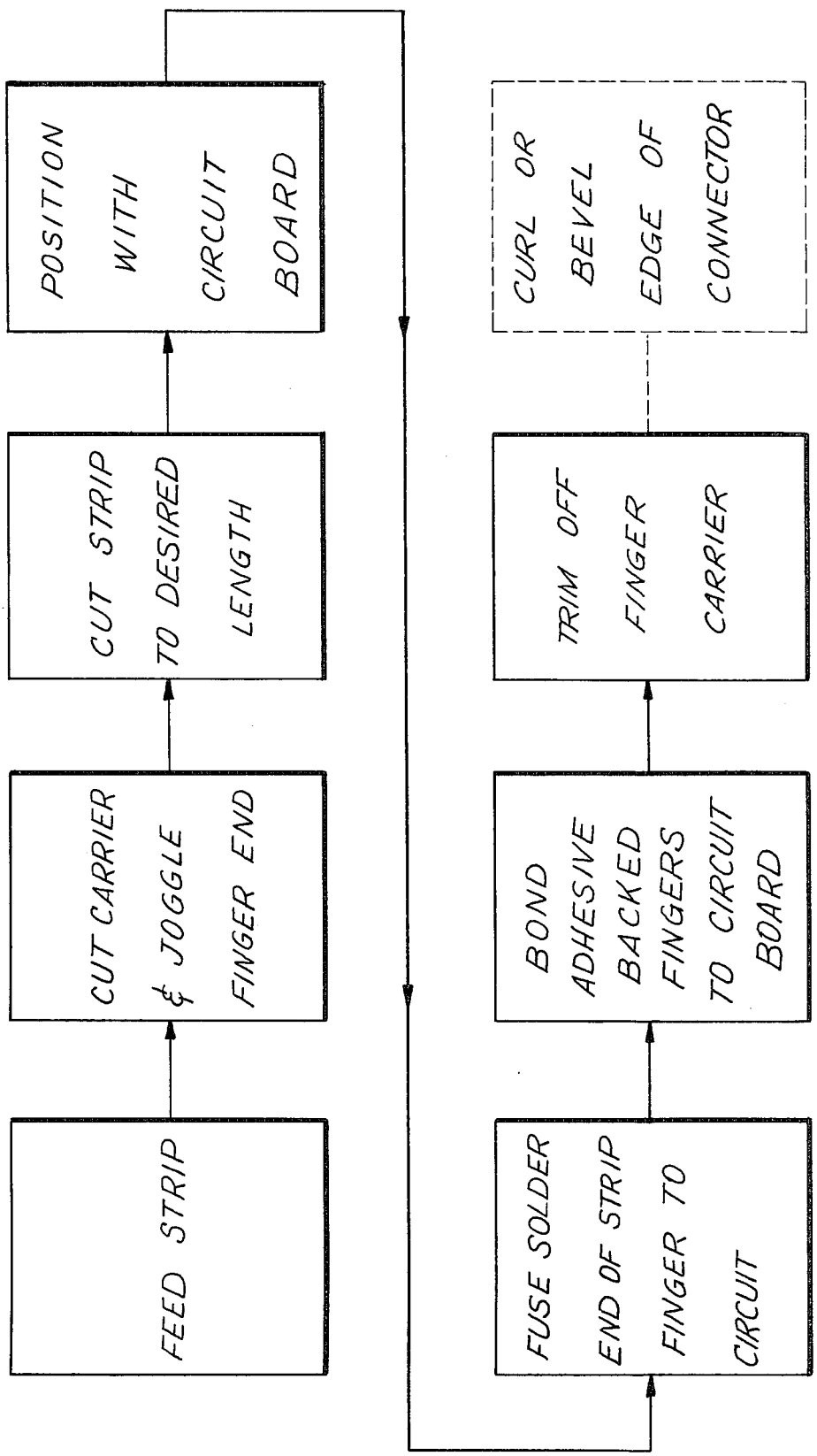
FIG. 16 is a block diagram indicating the primary steps of the method or process of mounting the fingers from the roll shown in FIG. 1 to the completed forms shown in FIGS. 11 and 12.

The presently preferred method of mounting the fingers 46 on the printed circuit board 54 will now be described in conjunction with FIGS. 5-12. The various process steps are shown in block diagram in FIG. 16. The first step of the method involves feeding the strip 36, such as unwinding the same from the roll 38, preferably by automated means to the region of the printed circuit board 54. Where the strip 36 is provided with two spaced carriers 42,44 a subsequent step is that of severing one of the carriers 42 from the fingers 44 as shown in FIG. 3. Where connecting tabs 48 are provided, severance may be at the tabs to form smaller tab portions 48a which remain on the carrier 42 and longer tab portions 48b which remain integrally attached with the fingers 46. The larger portions 48b are offset or "joggled" to provide a spaced parallel portions 48c and a transverse upright portions 48d. The height of the transverse portion 48d is selected to correspond with the thickness of the printed circuit conductors or leads 62 so that the parallel portion 48c can overlap the same to facilitate electrical joining therewith. The offsetting or joggling step is advantageously performed simultaneously or immediately subsequent to the step of severing the carrier 42 from the fingers 46. In the condition show in FIG. 3, the fingers 46 have free ends where the offset are formed and connected ends where the fingers are connected to the carrier 44. As suggested above, the provision of two carriers is optional and only one carrier can be utilized to maintain the desired spacing and orientations of the fingers relative to each other, as suggested by the strip of FIG. 3 wherein the carrier 42 has been severed.

Figure 5:
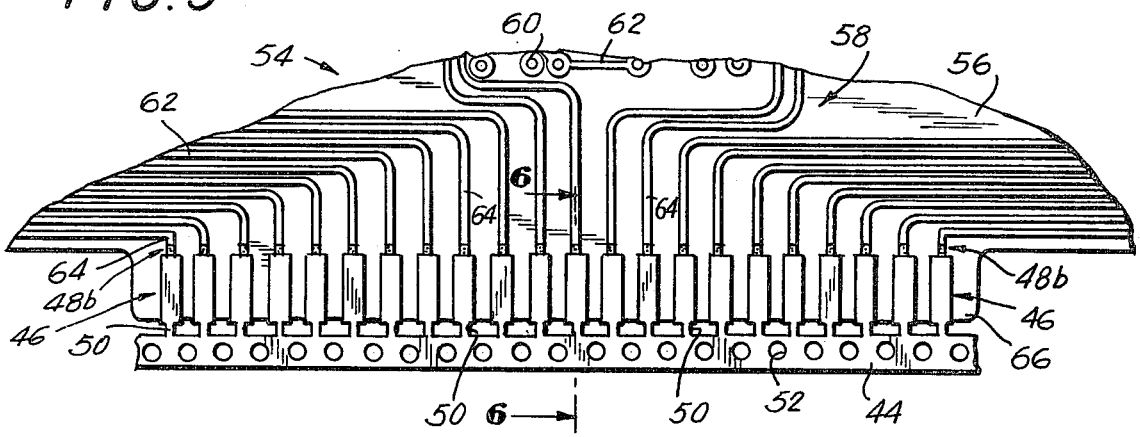
FIG. 5 is similar to FIG. 4, but showing a strip of the type shown in FIG. 3, subsequent to severance of one of the carriers and joggling of the connecting tabs, with the various fingers aligned with the printed circuit leads and with the offset portions or connecting tabs in overlapping relation with the printed circuit leads.
Figure 6:
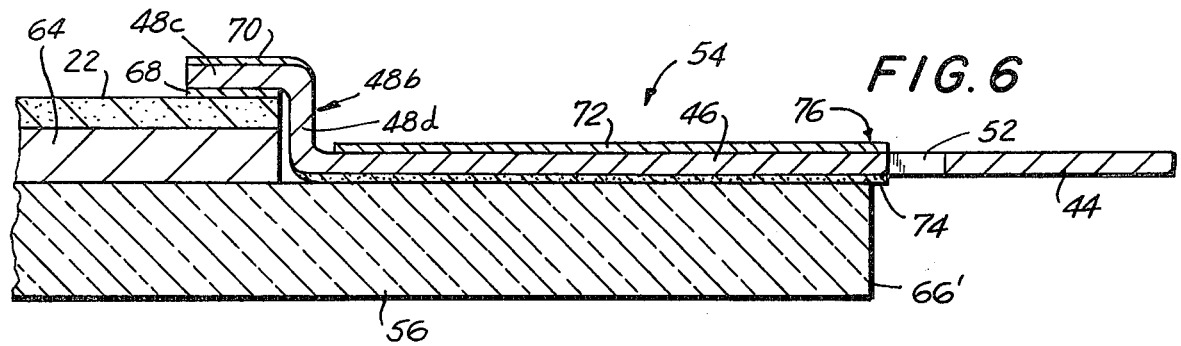
FIG. 6 is a cross-sectional view of the printed circuit and the conductive contact element strip taken along line 6—6 in FIG. 5.

With the fingers provided with the offsets 48b, the strip of conductive contact elements are aligned as shown in FIG. 5 with the free ends 64 of the conductors 62. Referring to FIGS. 5 and 6, the offsets 48b permit overlapping of the parallel portions 48c with the solder coated electrical conductors or leads printed on the circuit board while maintaining the fingers 46 in abutting relationship with the printed circuit board or laminate sheet.

The spacing between the fingers 46 along the direction of the carriers 42,44 is not in and of itself critical for the purposes of the present invention and various spacings are utilized commercially for different applications. Accordingly, the spacing between adjacent fingers is selected to correspond with the printed circuit edge-type connector which is to be utilized. In the presently preferred embodiment, the fingers 46 are uniformly spaced along the carriers although this is not a necessary requirement and, clearly, any arrangement of fingers or spacing therebetween along the carriers is possible. Where blank or dummy contacts are to be used for keying purposes, for example, the appropriate fingers 46 may be clipped from the strip so as to provide a blank space. Commercial realizations of the present invention can be provided in continuous strips offering different finger lengths and spacings between adjacent fingers to satisfy all commercial needs.

Aligning of the fingers 46 with the associated free ends of the printed circuit conductors or leads may be effected manually or automatically. Since in most cases the ends 64 of the leads are uniformly spaced as shown and correspond to the uniform spacing between adjacent fingers, it is only necessary to align one printed circuit lead with one finger in order to align all the fingers with their associated leads or conductors. Automated alignment may be effected by advancing the strip 36 along the board extension 66 to bring, for example, one of the fingers 46 in alignment with an edge or marking on the board extension 66 which is normal to the edge 66'. Where the leads or conductors are initially formed at known or selected spacings from the various edges of the printed circuit board, these dimensions can be selected so that monitoring and detection of one of such edges automatically provides the necessary or desired alignment of the strip with the various conductors or leads.

When the strip 36 is aligned as shown in FIGS. 5 and 6, the ends of the fingers which remain connected to the carrier 44 advantageously extend or project beyond the edge 66' for reasons which will become apparent hereafter. This is not a critical feature of the present invention although it provides certain advantages which will be described below.

As suggested above, the strip 36 is prefabricated and advantageously provided with the necessary finishings and coatings to permit the same to be directly applied to the printed circuit board 54 without any additional cumbersome mechanical or chemical processes. To this end, as suggested in FIGS. 2 and 3, and making specific reference to FIG. 6, the ends of the fingers 46 are provided with thin layers of solder and/or dry flux 68 to facilitate soldering of the parallel portions 48c to the copper conductors 64. As suggested in FIGS. 2 and 3, the provision of a thin layer of solder on the ends of the fingers may be effected by dip coating or plating the finger ends including the carriers 42,44 so that the carriers as well as the connecting strips or tabs 48,50 are precoated with such layers of solder or dry flux 68,70. A layer of solder can be provided on both sides of the fingers for overall appearance at the overlap or, if desired, butt joint (not shown). However, where the layers of solder and/or dry flux 68,70 can be economically or practically applied to only one side or surface of the finger ends, this is sufficient and equally serves the purpose since only one surface of the fingers are joined electrically to the printed circuit leads or conductors 64.

The main body portions of the fingers 46 are advantageously provided with a nickel, gold, tin, rhodium, combinations thereof or other desired layer of plating 72 on one surface of the fingers 46 while the other surface of the fingers are coated with a layer of adhesive 74 as shown in FIG. 6. While the adhesive 74 can be of any type which produces a permanent bond, it may be desirable, however, to use a temperature activatable adhesive which forms a substantially permanent bond once activated and permitted to set or cure.

Figure 7:
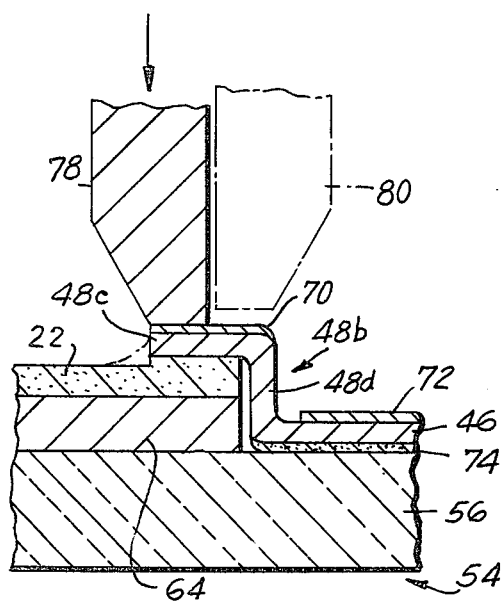
FIG. 7 is similar to FIG. 6, showing diagrammatically the manner in which a hot bar is applied to the overlapping junction between the joggled or offset portion of the finger and the printed circuit lead or conductor, the resulting application of heat melting the solder at the joint.
Figure 8:
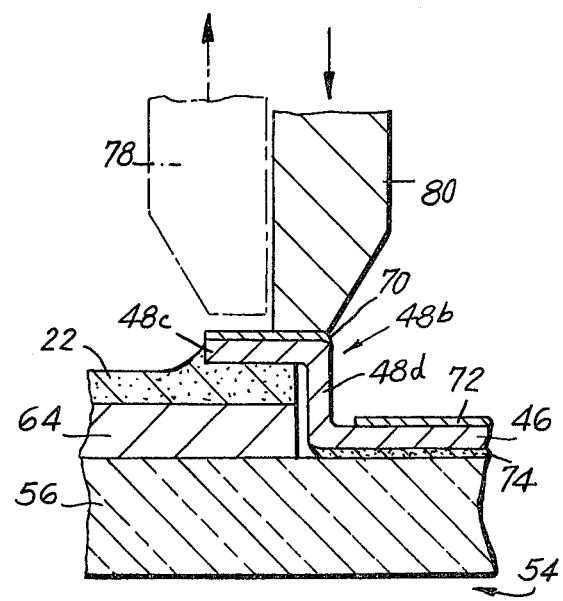
FIG. 8 is similar to FIG. 7, but showing the application of a cold bar to the aforementioned junction, with the hot bar raised, to remove the heat at the junction and to solidify the solder at the junction to fixedly join the joggled end portions of the fingers to the printed circuit leads or conductors.

During the alignment and positioning step of the fingers 46, the carrier strip 44 provides means for controlling the positions of the fingers and for maintaining the desired positions until the fingers are joined to the printed circuit board. Referring to FIG. 7, the parallel portion 48c of the offsets or joggles 48b are fused or soldered to the conductor ends 64 by means of a hot bar 78 which descends in pressure relationship against the parallel portions 48c to maintain alignment of the tabs and conductor ends and it applies heat thereto sufficient to melt the layer of solder or flux 68 as well as the layer of solder 22 on the conductors 64. After the solder at the junction has melted, but before the hot bar is removed, a cold bar 80 is lowered so that both hot and cold bard are briefly in contact with the parallel portion 48c. As best shown in FIG. 8, the cold bar 80 abuts against the parallel portion 48c in pressure relationship therewith to remove some of the heat from the junction to permit the solder to solidify to join the parallel portion 48c and the copper conductors 64 and to provide a substantially permanent electrical and/or mechanical conducting joint.

It will be appreciated that if the parallel portion 48c, for example, is to be electrically connected to the printed circuit conductor 64 by ultrasonic means, only one bar or electrode surface is necessary in order to serve as the source for providing the ultrasonic means or vibrations necessary to electrically and mechanically connect the parallel portion 48c to the printed circuit conductor end 64.

Referring to FIG. 9, the next step of the mounting process is the application of a heated bar 82 which is brought into pressure relationship substantially along the entire lengths of the fingers 46 to apply sufficient heat to activate and cure the heat activatable layer of adhesive 74 to provide a substantially permanent mechanical bond between the fingers 46 and the laminate 56. Advantageously, the heated bar 82 has a width and length sufficient to activate and cure the adhesive layers associated with all of the fingers in the series or row to simultaneously heat the adhesive layers associated with all the fingers 46. The bars 78, 80 and 82 may be made of any material, and may comprise a coated surface of a resilient material. The heated bar 82 is desirably made of silicone rubber, teflon or the like so that when these bars are brought into pressure relationship against the various finger portions they are permitted to somewhat deform and closely mate with the fingers to provide pressure thereon as well as good heat conduction without damaging the fingers or the printed circuit board.

As shown in FIG. 10, the next step of the process is to trim the fingers 46 and sever the remaining carrier 44. As suggested above, the fingers 46 are advantageously mounted on laminate sheet 56 with portions thereof extending beyond the edge 66' so that when removing means, such as a cutter, grinding wheel, milling cutter or a knife 84 is brought down to trim the fingers, the free ends or edges of the fingers are assured to be substantially flush with the edge 66' of the circuit board. For this purpose, it is preferred that the wider central portion of the fingers 46 be trimmed as opposed to the connecting tabs 48 or 50 since the finished or completed fingers desirably have the wider width along the entire lengths thereof once mounted on the boards.

After the finger trimming step, the board is substantially completed. However, in order to minimize the card-wear or finger-wear as well as effecting lower insertion forces of the card edges on which the fingers are formed, the board may be provided with bevels 86 as shown in FIG. 11. The board 54' of FIG. 11 is formed in the same manner as above-described with the exception that the above-described steps are performed twice, once for each surface of the board to form fingers in aligned positions on both surfaces of the board as shown. In FIG. 12, a printed circuit board 54" is shown, wherein the fingers 46 are trimmed to provide portions thereof which slightly extend beyond the edge 66' and the extended portions are curled as at 88 to round off the edges on the two sides of the laminate sheet 56. Again, this minimizes card-wear as well as requires lower insertion forces of the card edges into the edge-type connectors. Another advantage is that the embodiment of FIG. 12 eliminates the need for bevelling the leading edges.

While the parallel portions 48c have been described as being soldered to the printed circuit leads or conductors and the fingers 46 have been described as being adhesively bonded to the circuit board, other bonding techniques in each case may be used. Thus, electron beam, ultrasonic or laser beams may be utilized in conventional manners to provide both the electrical as well as mechanical bonding as described above. In each case, some form of adhesive or other treatment may be utilized which is energy activated to produce the bonding action only after the fingers are aligned and properly positioned with respect to the associated printed circuit leads or conductors on the printed circuit board.

While the method above-described for bonding the fingers or contacts to the printed circuit board 54 has included first joining means in the nature of a layer of solder 22 between the parallel portions 48c and the conductor end 64, and has further utilized second joining means in the form of a temperature activatable adhesive layer 74 for permanently bonding the major portions of the fingers or contacts to the substrate 56, other methods for making these first and second connections will become evident to those skilled in the art. Any method of connection which electrically and mechanically joins the parallel portions 48c and the conductor free ends 64, as well as any connection which permanently and mechanically joins the fingers 46 to the substrate 56 can be used. As an example with respect to just the first attaching means for electrically joining the parallel portions 48c to the conductor end 64, one could utilize ultrasonic bonding or welding, brazing, spot welding, conductive adhesives, mechanical joints, such as crimps and the like. It will be appreciated that some of these aforementioned means may be equally applicable to the second attaching means for mechanically joining the contacts or fingers to the circuit board.

Another feature of the present invention is that it lends itself to an excellent repair process for replacing a damaged finger or other type of contact. With conventional printed circuit boards having integral fingers or contacts, repairs are very difficult and generally not made if a finger is damaged, and the entire board is scrapped or discarded. One available process, however, for repairing a contact is disclosed in U.S. Pat. No. 3,765,076, but this process involves severing the damaged contact finger or fingers and the circuit board upon which they are mounted. With the prefabricated contacts or fingers of the present invention, one can simply replace a damaged finger or contact of a conventional or special circuit board by removing the damaged finger and attaching a single, separate contact or finger 46 (which may be severed or removed from the strip 36 or supplied individually).

FIG. 9A illustrates the broad concept of using the aforementioned energy means for the first attaching means to electrically and mechanically join the parallel portions 48c to the conductor ends 64, and to join the contact or finger 46 to the substrate 56 or printed circuit board 54a. The respective resulting bonds are designated by the reference numerals 22a and 74a. In lieu of an offset or joggle having transverse upright portions 48d, a plain butt joint can be formed with different degrees of advantage to join a conductive end 64 to a contact or finger 46 in a common or same plane.

While the presently preferred embodiments have been described with reference to elongate fingers 46 for use at the edges of printed circuit contact boards, conductive elements or contacts having different shapes may be utilized. Such contacts or elements could be joined along the edge of a printed circuit board of anywhere in the field of the board. It is within the scope of the invention to utilize the contact elements to form individual or a series of contact elements mechanically secured within the field of the circuit board and electrically and mechanically secured to a plurality of conductor ends uniformly arranged and distributed or randomly disposed within said field of the printed circuit board. In this connection, and for the purposes of the entire specification and the claims, the term "fingers" as used in connection with the Figures is intended to include all other types of contacts having varying shapes. Such different contacts include both planar as well as three-dimensional contacts which may serve as female or male connector elements which are suitable for mating with either standard or special connectors. Although the three-dimensional contact shown in FIG. 13 is hollow, tubular and resilient, that contact is only exemplary of the numerous three-dimensional shapes which can be used. Such contacts may be hollow, solid, rigid or resilient.

It should be evident from the above description that the fingers 46 are capable of being mounted on printed circuit boards without damaging any of the printed circuits as has frequently been the case when, for example, the electro-plater's tape was removed in the above-described prior art technique. Additionally, since the fingers 46 are finished prior to mounting on the circuit board, the various bonds between the fingers 46 and the printed circuit conductors on the board are not compromised during plating operations as was necessary in the prior art approach. For this reason, the fingers 46, once mounted on the printed circuit board as described above, are at least as reliably mounted on the substrate as were the prior art fingers and have equally good electrical characteristics.

Some additional embodiments of the present invention are shown in FIG. 13-15. In FIG. 13, a modified strip 36' is shown wherein the fingers 46' include at least one pair of shaped sections 90 as shown which projects out of the plane of the respective fingers and define slots 92 therebetween to form a male or female or other mutually cooperatively associated contact elements or receptacle after the carriers 42,44 have been severed from the fingers 46'. In FIG. 13, two such pairs of cylindrical sections are shown. In order to increase the surface for bonding the fingers 46 to the laminate sheet, there are advantageously provided a plurality of tabs 94 spaced along the lengths of the fingers 46' which provide the requisite planar surfaces on which the adhesive layers can be provided. With this arrangement, once the carriers have been severed, there is provided an array of serially spaced male or female connector terminals suitable for mating with cooperating male or female connector elements on a connector to be electrically connected to the printed circuit on the board.

In FIG. 14, a further modified embodiment 36" is shown which includes three elongate spaced carriers 98, 100 and 102 which are spaced from each other as shown and are parallel to each other along the length thereof. The carriers 98 and 100 are end carriers while the optional carrier 102 is a central carrier, if desired, which runs along a line of symmetry or fold line 104. The half of the strip 36" on each side of the line of symmetry 104 substantially corresponds to the strip 36 shown in FIGS. 1 and 2. In all of the embodiments in accordance with the present invention, the carriers are substantially coplanar with the fingers and are connected thereto at the ends of the fingers by means of connecting tabs 106, 108, 110 and 112. In FIG. 14, the strip 36" is similarly initially punched or die-cut from the planar sheet of material or chemically milled from such a sheet. However, prior to connection to a printed circuit board, the individual halves or portions on the opposite sides of the line of symmetry 104 are folded about that line as shown in FIG. 15. Once the carriers 98 and 100 are severed and the joggles or offsets 106a and 112a are formed, a space 114 is provided which is dimensioned to receive the edge portion 66 of the printed circuit board. As before, once the offset portions have been joined to the conductors on each surface of the printed circuit board and the fingers 46a, 46b have been joined to the laminate sheet, the central carrier 102, which includes portions 102a and 102b on each side of the line 104, as well as the connecting tabs 108 and 110 are severed from the fingers with whatever portions of the fingers project beyond the edge 66'. Where curls 88 are to be provided, portions of the fingers may be permitted to project beyond the card edge subsequent to severance of the carrier as described above.

The provision of fingers on two surfaces of the circuit board may be achieved by utilizing the double strip 96 as shown in FIGS. 14 and 15 or two individual strips 36 may be used wherein one strip is first mounted on one side of the laminate as described above and subsequently another strip is mounted on the other side of the laminate in accordance with the same procedure, with the rows of fingers on the two sides of the laminate being aligned along the length of the edge 66' to permit insertion of the projection or extension 66 with the fingers mounted thereon into an edge-type printed circuit board connector. Such connectors take on many forms, some providing single and others providing double read-outs. Thus, some connectors include two rows but have independent contacts, while other connectors provide two rows which are bridged or electrically connected to provide only a single contact. In both cases, boards having two sets of oppositely aligned fingers provide easier insertion into connectors since the forces on the board and on the connctor are more symmetrically distributed.

Clearly, the fingers of the present invention may be utilized with any form of edge-type connectors so long as such connectors are compatible with conventional or special printed circuit fingers and/or connectors as formed in accordance with the prior art technique. The fingers of the present invention have all the characteristics of such prior art fingers after the strip 36 has been mounted as above described. In this sense, the strip 36 in accordance with the present invention may serve as a total or complete substitute or replacement for conventionally formed fingers.

It is to be understood that the forgoing description of the various embodiments illustraated herein is exemplary only and various modifications to the embodiments shown herein may be made without departing from the spirit or scope of the invention.

What is claimed is:

1. An arrangement of conductive contact elements for mounting on a printed circuit board to form an array of serially spaced contacts or terminals at the free ends of a plurality of circuit leads or conductors on the circuit board, the arrangement comprising a pair of elongate spaced carriers which are parallel to each other; a plurality of contacts made from an electrically conductive material and being generally co-planar with said carriers, said contacts being serially spaced along the length direction of said carriers and extending between and being connected at opposing ends to the same to maintain the spacing between said contacts, at least one portion of each of said plurality of contacts being substantially planar and coplanar with at least one of said carriers and configurated to mate with the surface of the printed circuit board to which it is adapted to be abutted, at least one of said pair of elongate spaced carriers positioning said contacts during attachment of the same to the circuit board and said circuit leads or conductors; whereby selective removal of portions of one of said pair of carriers exposes one set of free ends of said contacts for attaching the same to similarly spaced associated free ends of circuit leads or conductors on the circuit board and subsequent severance of the other of said pair of carriers to electrically isolate selected ones of said plurality of contacts.

2. An arrangement as defined in claim 1, wherein said contacts are in the nature of elongate planar fingers.

3. An arrangement as defined in claim 2, wherein said fingers are parallel to each other and oriented in directions substantially normal to the length direction of said carriers.

4. An arrangement as defined in claim 1, wherein said contacts have a predetermined width, and are connected to said spaced carriers at opposing ends of said contacts by means of connecting tabs having widths less than said predetermined width.

5. An arrangement as defined in claim 1, wherein said contacts and said carriers are planar and generally coplanar with each other.

6. An arrangement as defined in claim 1, wherein said carriers are integrally formed with said contacts.

7. An arrangement as defined in claim 1, wherein at least one of said carriers is planar and is provided with a plurality of spaced sprocket holes along the length thereof.

8. An arrangement as defined in claim 5, wherein both of said carriers are provided with spaced sprocket holes along the lengths thereof.

9. An arrangement as defined in claim 1, further comprising a bond-promoting coating for attaching said contacts to a circuit board.

10. An arrangement as defined in claim 1, wherein said bond-promoting coating comprises a layer of adhesive.

11. An arrangement as defined in claim 10, wherein said adhesive is energy activatable.

12. An arrangement as defined in claim 1, wherein said plurality of contacts together define two sets of commonly facing surfaces respectively facing in opposing directions, said attaching means being provided on one set of surfaces; and further comprising a layer of plated conductive material on the other set of surfaces.

13. An arrangement as defined in claim 1, wherein said one set of free ends of said contacts is adapted to be electrically and mechanically joined to the free ends of the leads or conductors on the circuit board, and wherein said one set of free ends of said contacts is provided with a bond-promoting coating which can be activated after said free ends of said contacts and of said leads or conductors are placed into abutting relation to form an electrical joint.

14. An arrangement as defined in claim 1, wherein said one set of free ends of said contacts is adapted to be soldered to the free ends of the leads or conductors on the circuit board which leads or conductors have been provided with a top layer of solder, and wherein said bone-promoting layer comprises dry flux which is activated after said free ends of said contacts and of said leads or conductors are joined.

15. An arrangement as defined in claim 1, wherein said elongate carriers form a strip including a plurality of contacts.

16. An arrangement as defined in claim 15, wherein said strip is substantially longer than the lengths of said contacts and is arranged in a roll.

17. An arrangement as defined in claim 1, wherein each of said fingers includes at least one shaped three-dimensional section which projects from the plane of the respective finger and extend to one side thereof to form a connector contact.

18. An arrangement as defined in claim 1, wherein three elongate spaced carriers are provided which are parallel to each other, and being spaced from each other substantially in a common plane to form a pair of outer carriers and a central carrier, a plurality of elongate planar contacts being provided between said central carrier and each of said outer carriers, to form two parallel rows of contacts, the contacts in each row being aligned with each other along the length of said carriers, said central carrier having a width sufficient to permit folding thereof along a longitudinal line to bring corresponding contacts in each row substantially into coextensive or aligned relationship, whereby each row of contacts may be disposed on another side of the circuit board to produce a double array of serially spaced and aligned contacts or terminals on opposite sides of the circuit board suitable for engaging a cooperaring connector which is to be electrically connected to the printed circuit on said board.

19. An arrangement as defined in claim 1, wherein two parallel arrays of serially spaced contacts are disposed between and maintained in spaced relation by said carriers.

20. An arrangement as defined in claim 1, wherein said contacts are uniformly spaced from each other along the directions of said carriers.

21. An arrangement of conductive contact elements suitable for mounting on a printed circuit board to form an array of serially spaced connector contacts or terminals at the free ends of a plurality of circuit leads or conductors on the circuit board, the arrangement comprising an elongate carrier strip; a plurality of co-planar contacts each connected and extending from said carrier strip, said contacts being electically conductive and having at least portions planar and adapted to be joined to the circuit board, at least one of said planar portions being co-planar with said carrier strip, the spacing between said free ends of said plurality of circuit leads or conductors; and electrically conductive extensions at the other end of each contact adapted to be joined to an associated lead or conductor free end on the circuit board.

22. A conductive contact element suitable for mounting on a printed circuit board to form a connector contact or terminal at the end of a circuit conductor on the printed circuit board, the contact element comprising a generally planar body portion which is electrically conductive; attaching means on at least one planar surface of said body portion for attaching the same to the circuit board; an electrically conductive extension at one end of said body portion adapted to be joined to the circuit conductor on the printed circuit board; and a carrier provided at the other end of said body portion suitable for being gripped during securing and positioning of said body portion before and while the same is attached to the circuit board, at least a portion of said body portion being co-planar with said carrier, said conductive extension being attached to the circuit conductor on the printed circuit board, whereby removal of said carrier after said extension is attached to the circuit conductor on the circuit board and after said body portion is attached to the circuit board exposes said other end of said body portion and permits the same to mate with a cooperating connector element and make contact therewith.

23. An arrangement of conductive contact elements for mounting on a printed circuit board to form spaced contacts or terminals at the free ends of a plurality of circuit leads of conductors on the circuit board, the arrangement comprising elongate carrier means; and a plurality of contacts made from an electrically conductive material and being generally co-planar with said carrier means, and said contacts being connected to and spaced from each other along said carrier means and adapted to be disconnected therefrom for mounting on a printed circuit board, at least one portion of each of said plurality of contacts being substantially planar and co-planar with at least one of said carriers and configurated to mate with the surface of the printed circuit board to which it is adapted to be abutted, at least one of said pair of elongate spaced carriers positioning said contacts during attachment of the same to the circuit board and said circuit leads or conductors.

* * * * *